(12) United States Patent
Weichselgartner

(10) Patent No.: US 10,658,783 B2
(45) Date of Patent: May 19, 2020

(54) MECHANISM FOR SECURING A MODULE INSERTED INTO A MODULE RECEIVING FRAME TO THE MODULE RECEIVING FRAME

(71) Applicant: ODU GmbH & Co. KG, Mühldorf (DE)

(72) Inventor: Dominik Weichselgartner, Vilsbiburg (DE)

(73) Assignee: ODU GmbH & Co. KG, Mühldorf (DE)

( * ) Notice: Subject to any disclaimer, the term of this patent is extended or adjusted under 35 U.S.C. 154(b) by 0 days.

(21) Appl. No.: 16/168,909

(22) Filed: Oct. 24, 2018

(65) Prior Publication Data

US 2019/0123477 A1  Apr. 25, 2019

(51) Int. Cl.

| | | |
|---|---|---|
| *H01R 13/60* | (2006.01) | |
| *H01R 13/518* | (2006.01) | |
| *G01R 31/28* | (2006.01) | |
| *G01R 31/00* | (2006.01) | |
| *G06F 7/42* | (2006.01) | |
| *H01R 13/74* | (2006.01) | |
| *G01R 1/04* | (2006.01) | |

(52) U.S. Cl.
CPC ......... *H01R 13/518* (2013.01); *G01R 1/0416* (2013.01); *G01R 31/00* (2013.01); *G01R 31/2808* (2013.01); *G01R 31/2887* (2013.01); *G06F 7/42* (2013.01); *H01R 13/745* (2013.01)

(58) Field of Classification Search
CPC ......... G06F 1/187; G06F 7/42; G01R 1/0416; G01R 31/2887; G01R 31/2808; G01R 1/04; H01R 13/518; H01R 13/514; H01R 13/745; H05K 7/1421; H05K 7/1431
USPC ........................................ 439/540.1
See application file for complete search history.

(56) References Cited

U.S. PATENT DOCUMENTS

| | | | |
|---|---|---|---|
| 3,040,289 A | 6/1962 | Wicks | |
| 4,329,005 A * | 5/1982 | Braginetz | G01R 1/04 439/51 |
| 4,655,530 A | 4/1987 | Sheets et al. | |
| 5,562,458 A | 10/1996 | Stora et al. | |
| 6,147,873 A * | 11/2000 | Huang | H05K 7/1431 361/728 |

(Continued)

FOREIGN PATENT DOCUMENTS

| | | |
|---|---|---|
| CN | 201174086 Y | 12/2008 |
| CN | 202196720 U | 4/2012 |

(Continued)

*Primary Examiner* — Jean F Duverne

(57) ABSTRACT

A mechanism (4) for securing a module (5) inserted into a module receiving frame (1) to the module receiving frame (1) and releasing the module (5) for removal from the module receiving frame (1), comprising a catch (6) arranged on the module (5) or the module receiving frame (1), which catch (6) may be moved to and fro between an open position and a locking position of the catch (6), and a spring (7) for preloading the catch (6) into one of the two positions, the open position or the locking position. The mechanism (4) further comprises a catch holder (11), which may be moved to and fro between a retaining position, in which it holds the catch (6) back against the preloading of the spring (7), and a release position, in which it does not hold the catch (6) back against the preloading of the spring (7).

15 Claims, 6 Drawing Sheets

(56) References Cited

U.S. PATENT DOCUMENTS

| | | | |
|---|---|---|---|
| 6,547,587 B2 | 4/2003 | Hurst et al. | |
| 7,497,706 B2 * | 3/2009 | Daudin | H01R 13/514 |
| | | | 439/157 |
| 2001/0023774 A1 | 9/2001 | Kruse et al. | |
| 2001/0054891 A1 | 12/2001 | Sagawa | |
| 2002/0137389 A1 | 9/2002 | Hurst et al. | |
| 2006/0032652 A1 * | 2/2006 | Ashby | H05K 7/1421 |
| | | | 174/50 |
| 2007/0064385 A1 * | 3/2007 | Paul | G06F 1/187 |
| | | | 361/679.4 |
| 2013/0045625 A1 | 2/2013 | Sedberry, Jr. et al. | |

FOREIGN PATENT DOCUMENTS

| | | |
|---|---|---|
| CN | 206193636 U | 5/2017 |
| JP | S5066400 A | 6/1975 |
| JP | S59127179 U | 8/1984 |
| JP | H0768777 A | 3/1995 |
| JP | 2000035460 A | 2/2000 |
| NL | 6611891 A | 2/1967 |

\* cited by examiner

MECHANISM FOR SECURING A MODULE INSERTED INTO A MODULE RECEIVING FRAME TO THE MODULE RECEIVING FRAME

FIELD OF THE INVENTION

The invention relates to a mechanism for securing a module inserted into a module receiving frame to the module receiving frame and releasing the module for removal from the module receiving frame. The invention further relates to a module receiving frame having the mechanism. It also relates to a module having the mechanism. Furthermore, the invention relates to a system consisting of the mechanism, a module and a module receiving frame. Finally, the invention also relates to the receiver or an interchangeable test adapter for a mass interconnect, wherein the receiver or the interchangeable test adapter comprises the system.

BACKGROUND OF THE INVENTION

U.S. Pat. No. 4,655,530 A reveals a snap-in module for the frame of a receiver or a test adapter which is secured by means of a plunger, which is preloaded by a spring. A run-on bevel on the plunger ensures that the module snaps in automatically on insertion. To remove the module, the plunger is moved with a tool which can be screwed onto a thread of the plunger in order to release the module from the frame.

U.S. Pat. No. 3,040,289 A describes a similar solution, in which the modules are secured by a plunger which is preloaded with a spring, wherein the plunger/spring combination is in this case located on the receiver frame rather than on the module. A run-on bevel on the module ensures that the module snaps in automatically on insertion. To remove the module, the plunger has to be moved back against the spring force by means of a handle.

U.S. Pat. No. 6,547,587 B2 discloses a module with a fixed cam and a spring-loaded plunger. For insertion into a receiver frame, the module is fitted into the receiver frame from behind, wherein it is firstly placed with the cam into a corresponding slot in a rail on the bottom of the receiver frame, then tipped forwards and subsequently pushed upwards, in order there also to engage in a rail. In the process, the plunger is firstly pushed back from a front side of the upper rail against the spring force and, as soon as it has reached a hole through the upward movement of the module, is moved by the spring into the hole in order to secure the module. To remove the module, the plunger has to be moved back by means of a tool.

U.S. Pat. No. 5,562,458 A proposes fastening the modules to the frame with conventional bolts or screws. Likewise, U.S. Pat. No. 4,329,005 A refers merely to screws, which are intended to engage in slots.

CONCEPT UNDERLYING THE INVENTION

The object of the present invention is to provide an improved mechanism for securing a module inserted into a module receiving frame to the module receiving frame and releasing the module for removal from the module receiving frame. A further object of the invention is to provide an improved module receiving frame having the mechanism. An additional object of the invention is to provide an improved module having the mechanism. A further object of the invention is to provide an improved system consisting of the mechanism, a module and a module receiving frame. Finally, an object of the invention is to provide an improved receiver or an improved interchangeable test adapter for a mass interconnect, wherein the receiver or the interchangeable test adapter comprises the system.

SOLUTION ACCORDING TO THE INVENTION

The reference signs in all the claims have no limiting effect, but rather are merely intended to improve the clarity thereof.

The object addressed is achieved by a mechanism for securing a module inserted in a module receiving frame to the module receiving frame and releasing the module for removal from the module receiving frame. The mechanism according to the invention comprises a catch arranged on the module or the module receiving frame, which catch may be moved to and fro between an open position and a locking position. A spring is moreover provided for preloading the catch into one of the two positions, the open position or the locking position. The mechanism further comprises a catch holder, which may be moved to and fro between a retaining position, in which it holds the catch back against the preloading of the spring, and a release position, in which it does not hold the catch back against the preloading of the spring, and is configured and arranged such that both the retaining position and the release position are neutral positions of the catch holder.

For the purposes of the invention, "securing" means that the module can no longer be removed from the module receiving frame after securing without actuation of the mechanism. For the purposes of the present invention, the "locking position" denotes the position of the catch in which the module is secured by the catch in the module frame. In contrast, for the purposes of the present invention the "open position" denotes the position of the catch in which the module is not secured by the catch in the module frame.

For the purposes of the present invention, the "module receiving frame" is a frame in the interior of which one or more modules may be inserted and secured thereto as well as released therefrom and removed from the interior. The module receiving frame does not necessarily have to be closed but rather may also comprise one or more open sides or portions.

For the purposes of the present invention, the retaining position and the release position are in each case a "neutral position" if the catch holder, owing to its configuration and arrangement in the mechanism, no longer moves from the retaining position or the release position into the other one of the two positions, i.e. the release position or the retaining position respectively, in the event of the mechanism not being externally actuated.

Because the catch holder has a release position and a retaining position, it may advantageously be achieved that the catch may be fixed or immobilised in the open position, depending on the embodiment, such that the module may be conveniently inserted by a user into the module receiving frame. It is in particular possible for the user to avoid having, in order to be able to insert the module into the module receiving frame, constantly to actuate the catch against the force of the spring in order to hold it in the open position. Moreover, the invention advantageously enables the user, by moving the catch holder, depending on the embodiment, from the retaining position into the release position or from the release position into the retaining position, to allow (wherein the movement is preferably brought about by the spring) or bring about (preferably against the force of the spring) movement of the catch from the open position into the locking position in order to secure the module in the module receiving frame.

The object of the invention is moreover achieved by a module receiving frame having the above-described mechanism. In this respect, use may advantageously be made of the fact that the module receiving frame generally offers more installation space for the mechanism than the module. Moreover, in situations where the number of modules usable as alternatives to one another is significantly greater than the number of spaces available for modules in the frame, it may be more economical to provide the mechanism on the module receiving frame.

The object of the invention is however also achieved by a module having the above-described mechanism. Providing the mechanism on the module may in particular be of use when modules of different dimensions, in particular different widths at those points at which they are to be secured in the module receiving frame, are intended to be received in the module receiving frame. Because the mechanism is arranged on the modules, it is advantageously possible to ensure that the position of the mechanisms is not predetermined by the module receiving frame.

The object addressed is moreover achieved by a system consisting of the mechanism and a module or a module receiving frame. In such a system, mechanism, module and module receiving frame may be matched to one another for frictionless operation.

Finally, the object is achieved by a receiver or interchangeable test adapter for a mass interconnect, wherein the receiver or the interchangeable test adapter comprises the above-described system. Receivers and interchangeable test adapters of mass interconnects frequently contain modules which have regularly to be interchanged, depending on the measuring requirements. The invention is therefore particularly advantageous in such instances of use.

For the purposes of the present invention, a "mass interconnect" is a connector interface for connecting one or more test instruments with one or more test objects (the test object in this connection is also known as Device Under Test (DUT), or Unit Under Test (UUT)). The preferred mass interconnect is part of automatic test equipment (also known as ATE), comprising a mass interconnect and one or more test instruments. The ATE may also comprise one or more PCs (personal computers) for controlling the test instrument (s). Preferably, one or more of the test instruments comply with one or more of the following specifications: PXI (PCI eXtensions for Instrumentation), VXI (VME eXtensions for Instrumentation), LXI (LAN eXtensions for Instrumentation), GPIB (General Purpose Interface Bus), SCXI (Signal Conditioning Extension for Instrumentation), PCI (Peripheral Component Interconnect).

For the purposes of the present invention, a receiver is the component of the mass interconnect which may be connected with an interchangeable test adapter (or ITA), so as to connect the test adapter to the test instrument(s). For the purposes of the present invention, an "interchangeable test adapter" is the component of the mass interconnect which may on the one hand be interchangeably connected with the receiver and on the other hand with the actual test object(s) generally interchangeable on the interchangeable test adapter, in order to connect the test object via the interchangeable test adapter and the receiver to the test instrument(s).

PREFERRED EMBODIMENTS OF THE INVENTION

Advantageous developments and further developments, which may be used individually or in combination, constitute the subject matter of the dependent claims and the following description.

The spring of the preferred mechanism is configured as a spring plate, wherein the spring plate does not necessarily have to be planar but rather may also be curved, for example in an S shape or a C shape. The spring is preferably made from a metal, particularly preferably from spring steel. The preferred spring plate is therefore a spring metal sheet. However, the invention also encompasses embodiments of the spring and the spring plate made from other materials, for example from a resilient plastics material or from rubber. Thus, for example, a resiliently compressible piece of rubber which preloads the catch into one of the two positions (open position or locking position) may also be a spring for the purposes of the invention. The spring may also for example take the form of a spiral spring or a helical spring.

In one preferred embodiment of the invention, the spring is embodied in one piece with the catch. One advantage achieved by this embodiment of the invention is that the number of components of the mechanism may be reduced. Particularly preferably, this combination of catch and spring is formed from a plate, particularly preferably a metal sheet, wherein one portion of the plate or sheet forms the catch and another the spring. Particularly preferably, the combination of spring and catch, i.e. for example the plate or the metal sheet, which forms the spring and catch, additionally comprises a further portion, with which it is fastened to the module or the module receiving frame.

The preferred catch comprises at least one, particularly preferably two tabs, with which the catch interacts with a mating catch, which is arranged on that component of the two components (module or module frame) on which the catch is not located, in order to secure the module in the module receiving frame. The mating catch is preferably provided immovably on that component of the two components (module and module frame) on which the catch of the mechanism is not arranged.

The preferred catch holder is configured and arranged in the mechanism in such a way that movement of the catch holder from the release position into the locking position moves the catch against the preloading of the spring into one of the two positions (open position or locking position). Particularly preferably, by moving from its release position into its retaining position the catch holder moves the catch from its open position into its locking position. However, the invention also includes embodiments in which, by moving from the release position into the retaining position, the catch holder moves the catch from the locking position into the open position. The preferred catch holder is moreover configured and arranged in the mechanism in such a way that movement of the catch holder from the locking position into the release position releases the catch, such that the catch moves into one of the two positions (locking position or open position) through the force of the spring. Particularly preferably, the catch moves under the force of the spring from its locking position into its open position due to the movement of the catch holder from its retaining position into its release position. However, the invention also includes embodiments in which the catch moves from its open position into its locking position due to movement of the catch holder from its retaining position into its release position and under the force of the spring. These embodiments of the invention advantageously make it possible to ensure that both to move the catch from the open position into the locking position and also for movement of the catch from the locking position into the open position in each case all that is necessary is for the catch holder to be moved.

The catch holder is preferably of swivellable configuration. This advantageously makes it possible to ensure that the catch holder may be brought merely by swivelling from the retaining position into the release position and conversely from the release position into the retaining position. The swivel axis preferably extends perpendicular to a movement path of the catch holder between open position and locking position. The catch holder preferably acts on the catch in the locking position. In this case, the tangent perpendicular to the swivel axis of the catch holder extends, particularly preferably in the locking position, at the point at which the catch holder acts on the catch, perpendicular to the direction of the force which the catch exerts on the catch holder due to preloading of the spring. This makes it possible to ensure that, in the locking position, the catch does not exert any force component extending in a swivel direction on the catch holder. This may contribute to the locking position being a neutral position.

In the case of a preferred mechanism with a swivellable catch holder, the retaining position and the release position are spaced from one another by an angle of less than 280°, particularly preferably by 100° or less. In the case of a preferred mechanism with a swivellable catch holder, the retaining position and the release position are spaced from one another by an angle of more than 80°, e.g. between 80 and 100°. All the degrees stated are based on a full circle of 360°.

The preferred catch holder comprises an eccentric. In this way, the part of the eccentric remote from the swivel axis may advantageously act on the catch, in order to hold it in the locking position against the force of the spring. In this case, in its extended position, i.e. at its high level, the eccentric preferably holds the catch in the locking position against the force of the spring.

The catch holder may for example be configured as a screw or as a bolt with an eccentric head. The screw or the bolt is particularly preferably mounted swivellably in a hole in the module or the module receiving frame. In the event of the catch holder being configured as a screw, the hole is preferably equipped with an internal thread for screwing to the thread of the screw.

In one embodiment of the invention, the mechanism comprises one or more limit stops, for restricting the movement of the catch holder. Particularly preferably, one limit stop is arranged in such a way that it prevents the catch holder from being able to be moved beyond the retaining position on the way from the release position into the retaining position. With this embodiment of the invention, it may advantageously be ensured that the user may bring the catch holder reliably into the retaining position. In addition or alternatively, one limit stop is particularly preferably arranged in such a way that it prevents the catch holder from being able to be moved beyond the release position on the way from the retaining position into the release position. With this embodiment of the invention, it may advantageously be ensured that the user may bring the catch holder reliably into the release position.

A preferred mechanism comprises detent means for releasable snapping-in of the catch into one or more detent positions. "Releasable snapping-in" here means that the detent means cause mechanical resistance which has to be overcome in order to move the catch holder out of the detent position. In the case of a swivellable catch holder, the resistance is preferably resistance in a swivel direction about the swivel axis. A preferred detent position coincides with the retaining position of the catch holder. An additional or alternatively preferred detent position coincides with the release position of the catch holder.

The detent means may for example be formed by a lug or a recess in a part of the catch directed towards the module or module receiving frame and a recess or lug interacting in corresponding manner therewith in the module or module receiving frame. The catch is here preferably preloaded towards the module or the module frame by a detent spring (for example a split lock washer or a helical spring), which causes the mechanical resistance which needs to be overcome. In one exemplary embodiment, the catch holder is provided by a bolt which is mounted so as to be swivellable into a through-hole of the module receiving frame or of the module and mobile along the longitudinal axis thereof. On one side, the bolt is equipped with an eccentric head. On the side of the through-hole pointing away from the head, a detent spring is arranged which is fixed on the one hand to the module frame or module and on the other hand to the end of the bolt pointing away from the eccentric, so as to preload the eccentric towards the module or module frame.

In one preferred embodiment of the invention, the spring preloads the catch in the open position and the catch holder, in its retaining position, holds the catch back in the locking position thereof. In this way, a particularly simple design of a mechanism according to the invention may advantageously be achieved, in which the catch holder is arranged on the side of the catch remote from the module (if the mechanism is arranged on the module receiving frame) or from the module receiving frame (if the mechanism is arranged on the module) and the locking position of the catch lies further towards the module or module frame compared with the open position. Alternatively, the catch holder preloads the catch in the locking position. In this case, the catch holder, in its retaining position, holds the catch back in the open position thereof.

The mechanism is preferably arranged either on the module receiving frame or on the module. However, the invention also comprises embodiments in which some of the components of the mechanism are arranged on the module receiving frame and some on the module. In one preferred embodiment of the latter type, catch and spring are arranged on one of the two components (module receiving frame or module) and the catch holder is arranged on the other of these two components.

The preferred module receiving frame is equipped with positioning pins or positioning holes, which are able to interact respectively with positioning holes or positioning pins of the module. This may advantageously make it simpler for the user to insert the modules into the module receiving frame in the intended position. The positioning pin(s) is/are particularly preferably screwed onto the module or the module frame. Particularly preferably, the screwed-on positioning pin(s) serve(s) simultaneously to secure the spring or the one-piece combination of spring and catch to the module or the module frame.

The preferred module receiving frame offers space for more than one module, for example four or more, eight or more or twelve or more modules. One preferred module receiving frame is equipped with more than one mechanism according to the invention, for example with eight or more, 16 or more or 32 or more mechanisms. The module receiving frame particularly preferably comprises two mechanisms per receivable module, particularly preferably on two opposing bars of the module receiving frame; reliable securing of the modules is thus advantageously achievable. Through the provision of a plurality of mechanisms, it is also advantageously possible for a plurality of modules to be secured or released mutually independently in the module receiving frame, in particular in order to insert the modules mutually independently into the module receiving frame or remove them therefrom. The preferred module receiving frame is part of a receiver or an interchangeable test adapter of a mass interconnect.

If a module is equipped with the mechanism according to the invention, the module is preferably receivable in the module receiving frame of a receiver or an interchangeable test adapter of a mass interconnect. The preferred module is equipped with positioning pins or positioning holes which may respectively interact with the positioning holes or positioning pins of the module receiving frame in order to make it simpler for the user to insert the module(s) into the module receiving frame in the intended position. The positioning pin(s) are particularly preferably screwed onto the module. Particularly preferably, the screwed-on positioning pin(s) serve(s) simultaneously to secure the spring or the one-piece combination of spring and catch on the module.

The preferred receiver according to the invention comprises a module receiving frame for receiving at least one, preferably a plurality of interchangeable modules, which each comprise a connector for connection with one or more mating connectors of the interchangeable test adapter. The mating connectors are preferably parts of modules of the interchangeable test adapter, wherein each module particularly preferably corresponds with a module received in the receiver in such a way that, when operated as intended, the mating connector of the module of the interchangeable test adapter is connected with the corresponding connector of the module received in the receiver. In the same way, a preferred interchangeable test adapter comprises a module receiving frame for receiving at least one, preferably a plurality of, interchangeable modules which each comprise a mating connector for connection with one or more connectors of the receiver.

BRIEF DESCRIPTION OF THE DRAWINGS

Further advantageous configurations are described in greater detail below with reference to multiple exemplary embodiments illustrated schematically in the drawings, to which the invention is however not limited and in which.

DETAILED DESCRIPTION OF EMBODIMENTS OF THE INVENTION

In the description given below of preferred embodiments of the present invention, the same reference signs denote the same or comparable components.

Figure 1:
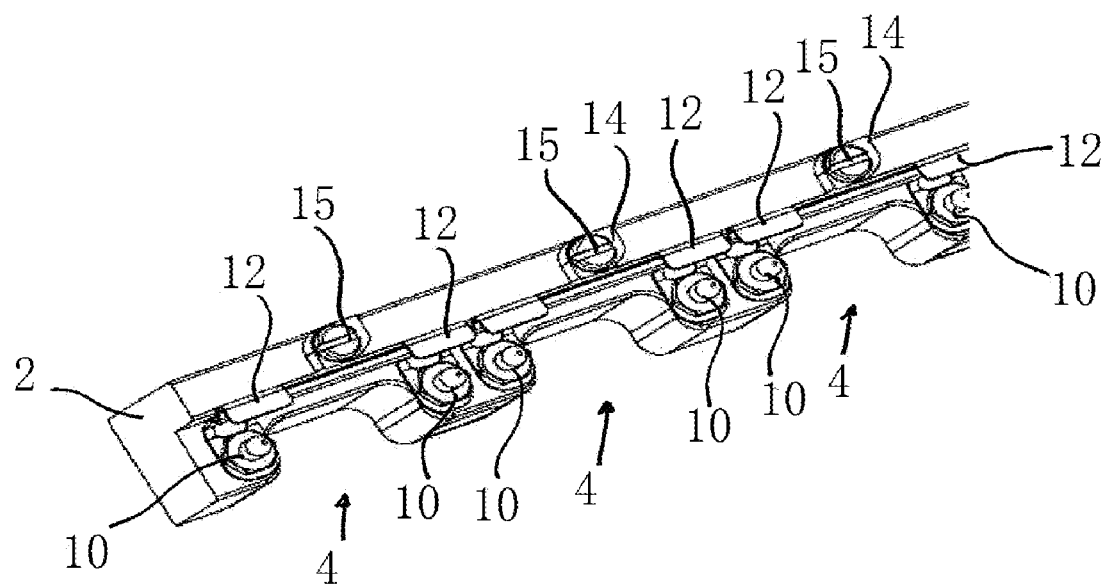
FIG. 1 shows a portion of a module receiving frame according to the invention consisting of an upper and a lower module receiving bar, which are each equipped with mechanisms according to the invention.
Figure 1:
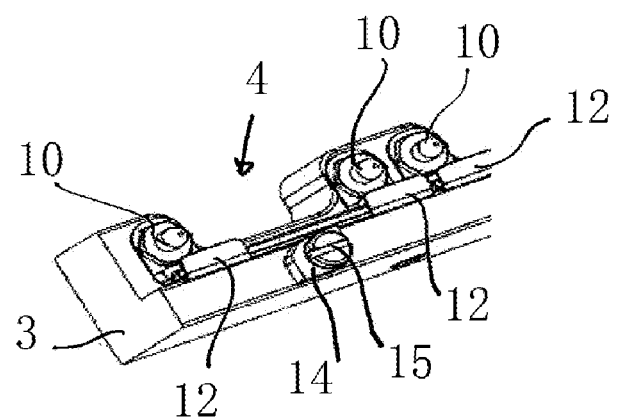
Figure 2:
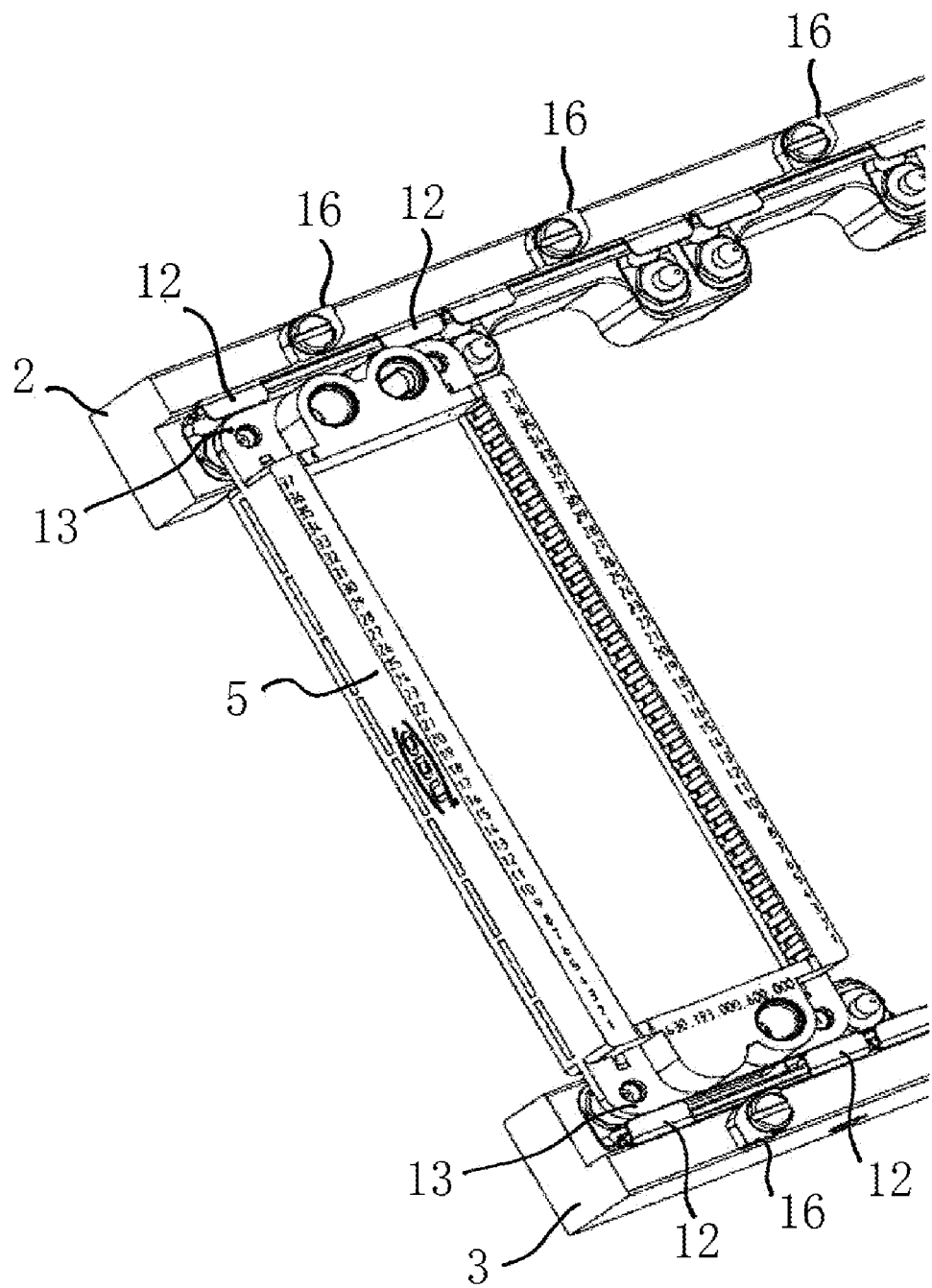
FIG. 2 shows the part of the module receiving frame depicted in FIG. 1 with a module inserted into the frame, wherein the catches of the mechanisms are in the open position and the catch holders in the release position.
Figure 3:
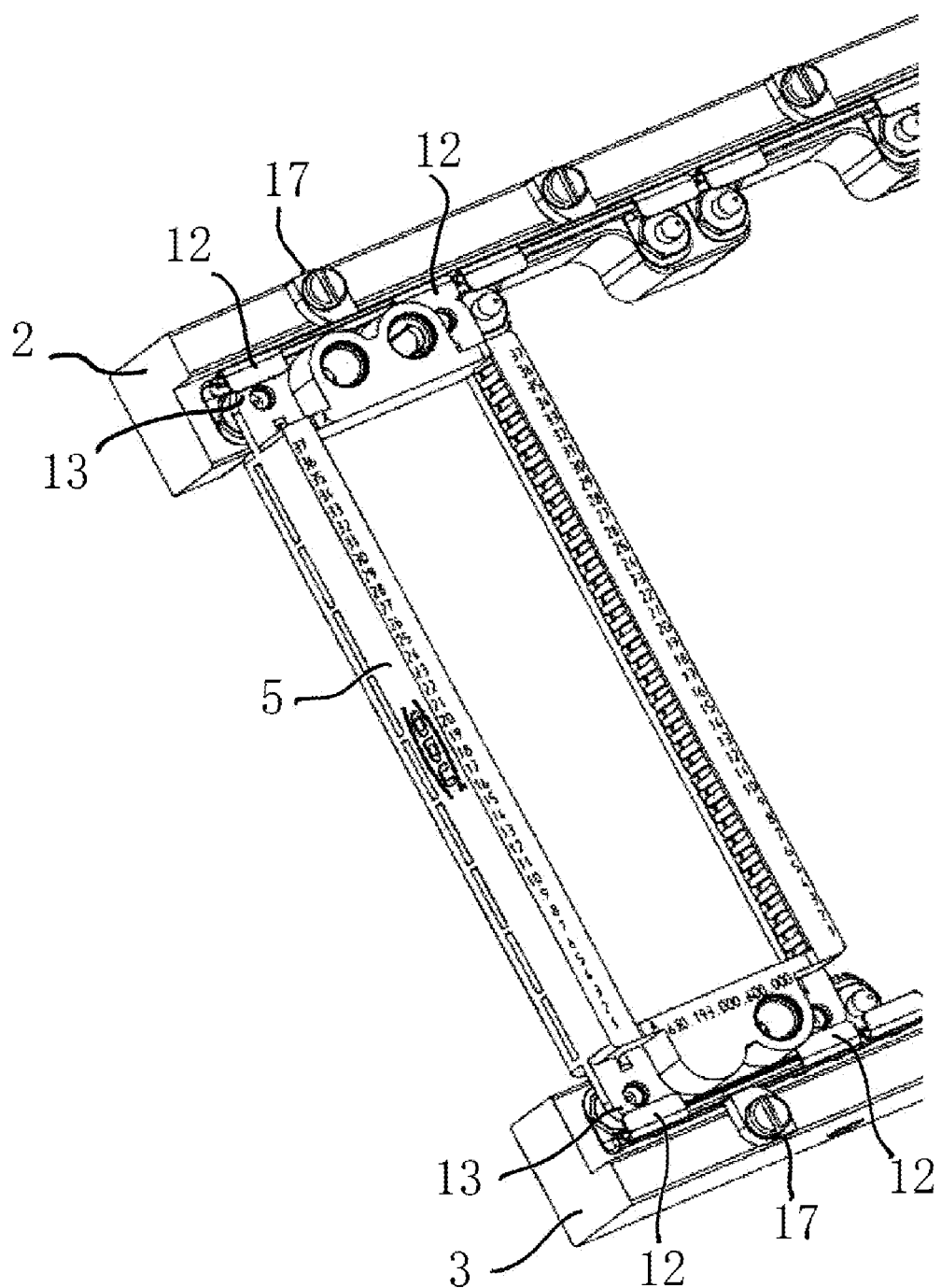
FIG. 3 shows the part of the module receiving frame depicted in FIG. 1 with a module inserted into the frame, wherein the catches of the mechanisms are in the locking position and the catch holders in the retaining position.
Figure 4:
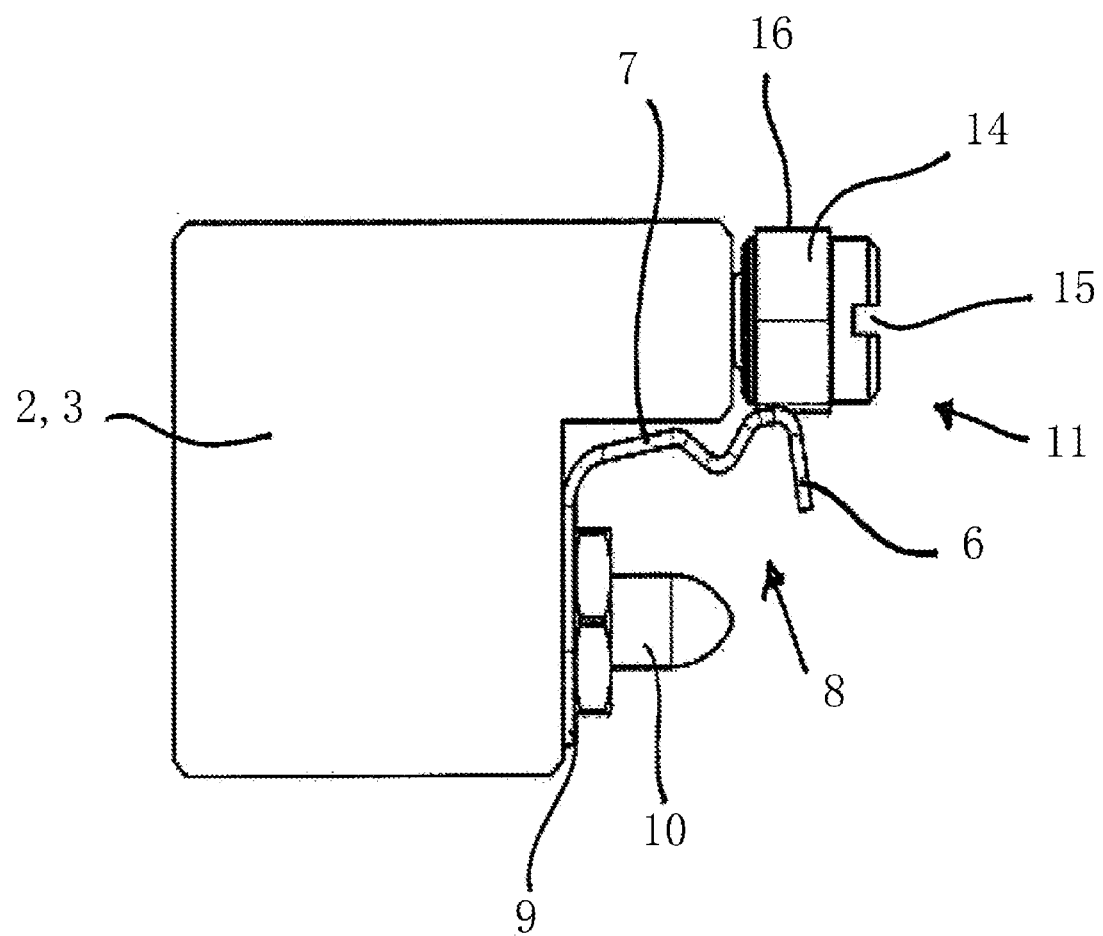
FIG. 4 shows a cross-section through a receiving bar of the module receiving frame of the preceding figures, wherein the catches of the mechanisms are in the open position and the catch holders in the release position.
Figure 5:
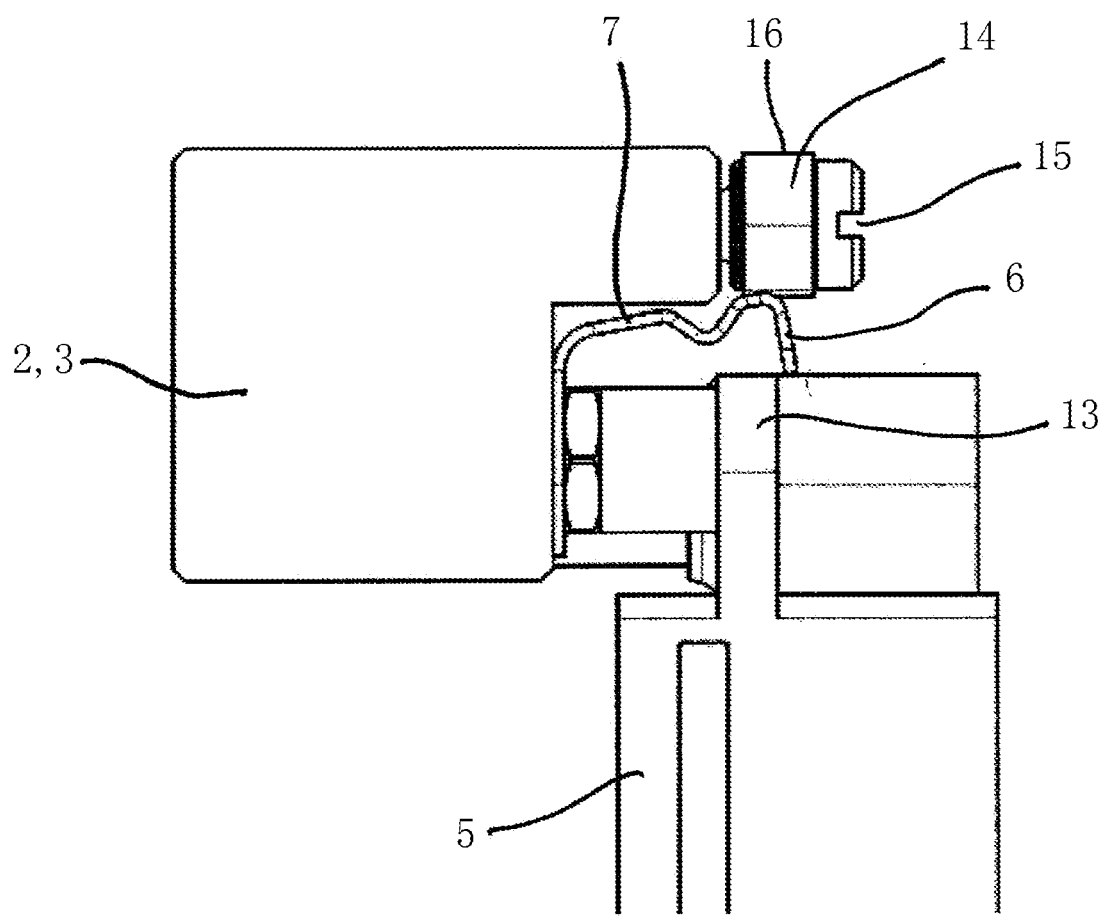
FIG. 5 shows the cross-section through the receiving bar depicted in FIG. 4 and the mechanism according to the invention, but this time with inserted module.
Figure 6:
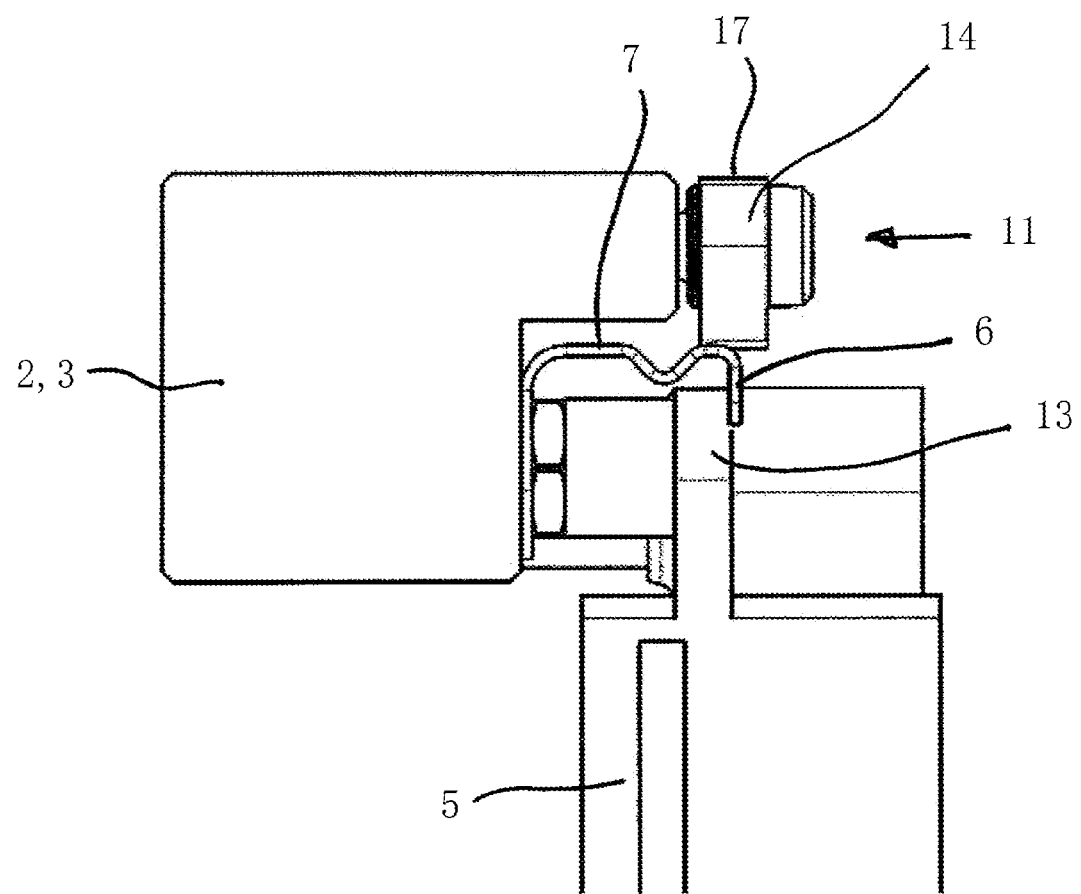
FIG. 6 shows the cross-section of FIG. 5, wherein this time, however, the catch is in the locking position and the catch holder in the retaining position.

The module receiving frame 1, which is depicted in the exemplary embodiment of FIGS. 1 to 6, consists of an upper 2 and a lower receiving bar 3. Each of these bars 2, 3 is arranged with a plurality of mechanisms 4 for securing a module 5 inserted into the module receiving frame 1 to the module receiving frame 1 and releasing the module 5 for removal from the module receiving frame 1. In FIGS. 1 to 3 three of these mechanisms 4 are depicted on the upper receiving bar 2 and two on the lower receiving bar 3.

Each mechanism 4 comprises a catch 6 which is formed in one piece together with a spring 7 by a bent piece of spring metal sheet 8. The front part of this metal sheet 8 forms the catch 6, a middle part the spring 7 and a lower part a base 9, with which the spring 7 is screwed in place on one of the receiving bars 2, 3 by positioning pins 10. The spring 7 exhibits S-shaped curvature, to prevent it from striking the receiving bar 2, 3 in the open position. The catch 6 comprises a first part, with which it strikes a catch holder 11 and a part bent away therefrom and having two tabs 12 which, as may best be seen in FIGS. 5 and 6, may interact with a mating catch 13 of the module 5 in mutually engaging manner so as to secure the module 5 in the module receiving frame. To this end, the catch 6 may be moved against the force of the spring 7 from an open position, shown in FIGS. 1, 2, 4 and 5, into a locking position, shown in FIGS. 3 and 6. Moreover, the force of the spring 7 may move the catch 6 from the locking position back into the open position, insofar as it is not prevented from doing so by a catch holder 11. In the open position the tabs of the catch release the mating catch, such that the module 5 may be removed from the module receiving frame 1.

The catch holder 11 takes the form of an eccentric screw, which comprises an eccentric head 14, and a shank, not shown in the figures, which comprises an external thread with which the eccentric screw is screwed into a hole in the receiving bar 2, 3 provided with an internal thread. Moreover, the eccentric screw has a slot 15 in its head 14, into which a screwdriver may be inserted in order to swivel the eccentric screw about its longitudinal axis from the release position shown in FIGS. 1, 2, 4 and 5 into the retaining position shown in FIGS. 3 and 6 or back from the retaining position into the release position. Retaining position and release position form an angle to one another of 90°. By moving the eccentric head 14 from the release position into the retaining position, the catch 6 is moved against the force of the spring 7 from its open position into its locking position. In the locking position, the spring 7 has the effect that the catch 6 exerts a force on the catch holder 11 which acts precisely perpendicular to a tangent of the catch holder 11 which extends through the contact point between catch 6 and catch holder 11 and perpendicular to the swivel axis of the catch holder 11. This ensures that the catch 6 does not exert any force on the catch holder 11 which extends in a swivel direction of the catch holder 11.

An embodiment of the mechanism 4 which is not shown in the figures additionally comprises a limit stop which is arranged parallel to the catch 6 and adjacent the catch holder 11 on the opposite side of the catch holder 11. This interacts with the upper edge 16, shown in FIG. 2, of the eccentric head 14 and the upper edge 17, shown in FIG. 3, of the eccentric in such a way that the eccentric cannot be moved beyond the release position during movement from the retaining position into the release position or beyond the retaining position during movement from the release position into the retaining position.

In an embodiment of the mechanism 4 likewise not shown in the figures, a detent means is provided for releasable snapping-in of the catch holder 11 in the retaining position and in the release position. These consist of a lug, which is arranged on the side of the eccentric head 14 of the catch holder 11 facing the receiving bar 2, 3, and two corresponding recesses in the surface of the receiving bar 2, 3, which are arranged such that in the retaining position of the catch holder 11 the lug may engage in one of these recesses and in the release position of the catch holder in the other of the two recesses. The shank of the catch holder in this case takes the form of a bolt without screw thread and the hole in the receiving bar 2, 3 is a through-hole, wherein the bolt passes right through and beyond the through-hole. On the opposite side of the receiving bar 2, 3 from the head, a helical spring is arranged as a detent spring, which on one side is fixed to this side of the receiving bar and on its other side to the end of the bolt, such that the head 14 is preloaded towards the receiving bar 2, 3 by means of the spring. The spring then causes resistance, which has to be overcome to move the catch holder 11 out of the retaining position or the release position.

In the exemplary embodiment of the invention shown in FIGS. 1 to 6, the catch holder 11 is arranged on the side of the catch 6 remote from the module 5. The spring 7 of the catch 6 preloads the latter in its open position and the catch holder 11, in its retaining position, holds the catch 6 back in the locking position thereof.

In a second embodiment of the invention not shown in the figures, the catch holder 11 is arranged between catch 6 and module 5 and the spring 7 preloads the catch 6 into the locking position. Then the catch holder 11, in its retaining position, holds the catch 6 back in its open position.

In the exemplary embodiment of FIGS. 1 to 6, the mechanism 4 is arranged on the module frame 1. In an alternative, third embodiment of the invention, the mechanism 4 as described is instead arranged on the module 5 and the mating catch 13 is arranged on a receiving bar 2, 3 of the module receiving frame 5.

In a fourth embodiment of the invention, spring 7 and catch 6, as shown in FIGS. 1 to 6, are arranged on the receiving bar 2, 3, wherein the spring 7 preloads the catch 6, but into its locking position. The catch holder 11 is arranged on the module 5, specifically adjacent to the catch 6, such that in its retaining position the catch holder 11 holds the catch 6 in its open position against the preloading of the spring 7.

A fifth embodiment is identical to the fourth embodiment except that receiving bar 2, 3 and module 5 have been reversed relative to the mechanism 4, catch 6 and spring 7 thus being arranged on the module 5, as in the third embodiment, but the catch holder 11 being arranged on the receiving bar 2, 3.

The module receiving frame 1 shown in FIGS. 1 to 6 is part of a receiver for a mass interconnect. In this embodiment, the module 5 is an interchangeable module 5 for connecting one or more test instruments by means of the mass interconnect. To this end, the module 5 is equipped as a connector with connecting elements, not shown in the figure, such as pins and sockets, which are capable of interacting with corresponding connecting elements of an interchangeable test adapter of the mass interconnect.

In an alternative embodiment of the invention, the module receiving frame 1 shown in FIGS. 1 to 6 is part of an interchangeable test adapter for a mass interconnect. The module 5 is an interchangeable module for connecting one or more test objects by means of the mass interconnect. To this end, the module 5 is equipped as a connector with connecting elements, not shown in the figure, such as pins and sockets, which are capable of interacting with corresponding connecting elements of a receiver of the mass interconnect.

The features disclosed in the above description, the claims and the drawings may be of significance for implementation of the invention in its various embodiments either individually or in any desired combination.

LIST OF REFERENCE SIGNS

1 Module receiving frame
2 Upper receiving bar
3 Lower receiving bar
4 Mechanism
5 Module
6 Catch
7 Spring
8 Spring metal sheet
9 Base
10 Positioning pin
11 Catch holder
12 Tab
13 Mating catch
14 Eccentric head
15 Slot
16 Upper edge of eccentric head in release position
17 Upper edge of eccentric head in retaining position

The invention claimed is:

1. Mechanism for securing a module inserted into a module receiving frame to the module receiving frame and releasing the module for removal from the module receiving frame, comprising a catch arranged on the module or the module receiving frame, which catch may be moved to and fro between an open position and a locking position of the catch, and a spring for preloading the catch into one of the two positions, the open position or the locking position, wherein the catch is configured for interacting with a mating catch in order to secure the module in the module receiving frame, wherein the mechanism further comprises a catch holder provided in addition to the catch and the mating catch, which may be moved to and fro between a retaining position, in which it holds the catch back against the preloading of the spring, and a release position, in which it does not hold the catch back against the preloading of the spring, and is configured and arranged such that both the retaining position and the release position are neutral positions of the catch holder.

2. Mechanism according to claim 1, wherein the spring is configured as a spring plate.

3. Mechanism according to claim 1, wherein the spring and the catch are embodied in one piece.

4. Mechanism according to claim 1, wherein the catch holder is of swivellable configuration.

5. Mechanism according to claim 4, wherein the catch holder comprises an eccentric.

6. Mechanism according to claim 1, wherein the mechanism comprises one or more limit stops, for restricting the movement of the catch holder.

7. Mechanism according to claim 1, wherein the mechanism comprises detent means for releasable snapping-in of the catch holder into one or more detent positions.

8. Mechanism according to claim 1, wherein the spring preloads the catch into the open position.

9. Module receiving frame having the mechanism according to claim 1.

10. Module receiving frame according to claim 9, wherein it comprises two or more mechanisms according to claim 1.

11. Module receiving frame according to claim 10, wherein the module receiving frame is part of a receiver or an interchangeable test adapter of a mass interconnect.

12. Module having the mechanism according to claim 1.

13. System consisting of a mechanism according to claim 1, a module and a module receiving frame.

14. System according to claim 13, wherein that component of the two components module and module receiving frame on which the catch of the mechanism is not arranged comprises a mating catch which interacts with the catch in the closed position thereof in order to secure the module in the module receiving frame.

15. Receiver or interchangeable test adapter for a mass interconnect, wherein the receiver or the interchangeable test adapter comprises a system according to claim 13.

* * * * *

UNITED STATES PATENT AND TRADEMARK OFFICE
CERTIFICATE OF CORRECTION

PATENT NO. : 10,658,783 B2
APPLICATION NO. : 16/168909
DATED : May 19, 2020
INVENTOR(S) : Dominik Weichselgartner Page 1 of 1

It is certified that error appears in the above-identified patent and that said Letters Patent is hereby corrected as shown below:

On the Title Page

Item (30) the following Foreign Application Priority Data should read:
October 25, 2017 (DE)............ 102017124949.4

Signed and Sealed this
Eighteenth Day of August, 2020

Andrei Iancu
*Director of the United States Patent and Trademark Office*